(12) United States Patent
Eichler et al.

(10) Patent No.: US 10,027,090 B2
(45) Date of Patent: Jul. 17, 2018

(54) LASER DIODE CHIP

(71) Applicant: OSRAM Opto Semiconductors GmbH, Regensburg (DE)

(72) Inventors: Christoph Eichler, Donaustauf (DE); Teresa Wurm, Mintraching (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/498,751

(22) Filed: Apr. 27, 2017

(65) Prior Publication Data

US 2017/0338626 A1 Nov. 23, 2017

(30) Foreign Application Priority Data

May 17, 2016 (DE) .................. 10 2016 109 022

(51) Int. Cl.
*H01S 5/00* (2006.01)
*H01S 5/34* (2006.01)
*H01S 5/30* (2006.01)
*H01S 5/343* (2006.01)

(52) U.S. Cl.
CPC ............ *H01S 5/3407* (2013.01); *H01S 5/309* (2013.01); *H01S 5/34333* (2013.01); *H01S 5/34346* (2013.01)

(58) Field of Classification Search
CPC . H01S 5/3407; H01S 5/34346; H01S 5/34333
See application file for complete search history.

(56) References Cited

U.S. PATENT DOCUMENTS

| 5,351,254 A * | 9/1994 | Tomita ................ B82Y 20/00 |
| | | 372/45.01 |
| 7,791,081 B2 | 9/2010 | Peter et al. |
| 2002/0179923 A1 | 12/2002 | Morita et al. |
| 2005/0224781 A1 | 10/2005 | Kneissl et al. |

(Continued)

FOREIGN PATENT DOCUMENTS

DE 102005048196 A1 2/2007

*Primary Examiner* — Yuanda Zhang
(74) *Attorney, Agent, or Firm* — Slater Matsil, LLP

(57) ABSTRACT

A laser diode chip is described. In an embodiment the laser diode chip includes an n-type semiconductor region, a p-type semiconductor region and an active layer arranged between the n-type semiconductor region and the p-type semiconductor region, wherein the active layer is in the form of a single quantum well structure. The single quantum well structure includes a quantum well layer, which is arranged between a first barrier layer and a second barrier layer, wherein the first barrier layer faces the n-type semiconductor region, and the second barrier layer faces the p-type semiconductor region. An electronic bandgap $E_{QW}$ of the quantum well layer is smaller than an electronic bandgap $E_{B1}$ of the first barrier layer and smaller than an electronic bandgap $E_{B2}$ of the second barrier layer, and the electronic bandgap $E_{B1}$ of the first barrier layer is larger than the electronic bandgap $E_{B2}$ of the second barrier layer.

14 Claims, 6 Drawing Sheets

(56) References Cited

U.S. PATENT DOCUMENTS

2011/0227033 A1* 9/2011 Kushibe .................. H01L 33/06
                                                          257/13
2016/0111595 A1* 4/2016 Lee ........................ H01L 33/06
                                                          257/13

* cited by examiner

LASER DIODE CHIP

CROSS-REFERENCE TO RELATED APPLICATIONS

This application claims the priority of German patent application 10 2016 109 022.0 filed May 17, 2016, which is hereby incorporated herein by reference.

TECHNICAL FIELD

The invention relates to a laser diode chip, in particular to a laser diode chip based on a nitride compound semiconductor material.

BACKGROUND

During operation of laser diode chips based in particular on a nitride compound semiconductor, it is found that the laser threshold and the operating current depend on the temperature.

SUMMARY

Embodiments of the invention define a laser diode chip for which the temperature dependency of the laser threshold and of the operating current is reduced.

According to at least one embodiment, the laser diode chip comprises a p-type semiconductor region, an n-type semiconductor region and an active layer arranged between the p-type semiconductor region and the n-type semiconductor region, which layer is in the form of a single quantum well structure (SQW). The active layer of the laser diode chip thus preferably contains only one quantum well layer, and differs in this respect from a multi-quantum well structure (MQW).

According to at least one embodiment, the single quantum well structure comprises a quantum well layer, which is arranged between a first barrier layer and a second barrier layer, wherein the first barrier layer faces the n-type semiconductor region, and the second barrier layer faces the p-type semiconductor region. The electronic bandgap $E_{QW}$ of the quantum well layer is smaller than the electronic bandgap $E_{B1}$ of the first barrier layer and smaller than the electronic bandgap $E_{B2}$ of the second barrier layer.

For the laser diode chip described here, the electronic bandgap of the first barrier layer is advantageously larger than the electronic bandgap of the second barrier layer. The single quantum well structure thus has an asymmetric design as regards the bandgaps of the barrier layers, wherein the bandgap of the first barrier layer on the n-side is larger than the bandgap of the second barrier layer on the p-side. It has been found that this improves the injection of the charge carriers into the quantum well layer and in particular reduces the loss of charge carriers from the quantum well layer at higher temperatures. The temperature dependency of the laser threshold and of the operating current is thereby reduced. Another result of this is better efficiency and improved ageing stability of the laser diode chip.

In an advantageous embodiment, the difference between the electronic bandgaps of the first barrier layer and of the second barrier layer is given by $E_{B1}-E_{B2} \geq 0.04$ eV. The bandgap $E_{B1}$ of the first barrier layer is preferably at least 0.1 eV larger, more preferably 0.2 eV larger, than the bandgap $E_{B2}$ of the second barrier layer.

According to a preferred embodiment, the laser diode, in particular the single quantum well structure contained therein, is based on a nitride compound semiconductor. In particular, the quantum well layer, the first barrier layer and the second barrier layer can each comprise $In_xAl_yGa_{1-x-y}N$, where $0 \leq x \leq 1$, $0 \leq y \leq 1$ and $x+y \leq 1$. In this case, this material need not necessarily have a composition given mathematically exactly by the above formula. In fact it can comprise one or more dopants and additional constituents that do not substantially alter the characteristic physical properties of the $In_xAl_yGa_{1-x-y}N$ material. For the sake of simplicity, however, the above formula includes only the essential constituents of the crystal lattice (In, Al, Ga, N), even though these constituents may also be partially replaced by small quantities of other materials.

The bandgap of the barrier layers and/or of the quantum well layer can be adjusted in particular by the material composition. An increase in the bandgap can be achieved in particular by increasing the aluminum content y and/or reducing the indium content x. Thus preferably the indium content x of the first barrier layer and/or second barrier layer is lower than the indium content x of the quantum well layer in order to achieve a larger bandgap in the barrier layers than in the quantum well layer. Alternatively or additionally, the aluminum content y of the first barrier layer and/or second barrier layer can be higher than the aluminum content y of the quantum well layer. It is thereby possible to increase the bandgap of the first and second barrier layers compared with the quantum well layer.

For the barrier layers, it holds that preferably the aluminum content y of the first barrier layer is higher than the aluminum content y of the second barrier layer, and/or the indium content x of the first barrier layer is lower than the indium content x of the second barrier layer. This advantageously achieves that the first barrier layer has a larger bandgap than the second barrier layer.

In an advantageous embodiment, the first barrier layer comprises $In_xAl_yGa_{1-x-y}N$, where $0 \leq x \leq 0.07$, $0 \leq y \leq 0.1$ and $x+y \leq 1$. For the indium content of the first barrier layer, it preferably holds that $x \leq 0.04$, more preferably $x \leq 0.02$. The aluminum content of the first barrier layer is preferably $y \leq 0.05$, more preferably $y \leq 0.01$.

In another advantageous embodiment, the second barrier layer comprises $In_xAl_yGa_{1-x-y}N$, where $0 \leq x \leq 0.1$, $0 \leq y \leq 0.07$ and $x+y \leq 1$. For the indium content of the second barrier layer, it preferably holds that $x \leq 0.08$, more preferably $x \leq 0.06$. The aluminum content of the second barrier layer is preferably $y \leq 0.03$, more preferably $y \leq 0.01$.

In a preferred embodiment, the first barrier layer has a thickness of between 0.25 nm and 30 nm. The thickness of the first barrier layer preferably equals between 1.5 nm and 10 nm, more preferably between 2 nm and 5 nm.

The second barrier layer can have a thickness of more than 1 nm, for example, or preferably of more than 7 nm. More preferably, the thickness of the second barrier layer is more than 10 nm. It is advantageous in particular when the thickness of the second barrier layer is greater than the thickness of the first barrier layer. It has been found that an asymmetric thickness of the barrier layers, with the second barrier layer having a greater thickness than the first barrier layer, is advantageous for the charge carrier injection into the single quantum well structure.

According to another advantageous embodiment, the first barrier layer is doped and the second barrier layer is undoped. In a nitride compound semiconductor material, the doping and the dopant concentration affect in particular also piezoelectric fields. In this regard, it has been found that doping solely the first barrier layer advantageously contributes to an increase in the efficiency.

In particular, the first barrier layer can be n-type, with the dopant being silicon, for example. The dopant concentration in the first barrier layer is advantageously less than $6*10^{19}$ cm$^{-3}$, preferably between $1*10^{17}$ cm$^{-3}$ and $3*10^{19}$ cm$^{-3}$, more preferably between $8*10^{17}$ cm$^{-3}$ and $1*10^{19}$ cm$^{-3}$.

If the second barrier layer is doped, advantageously it has a dopant concentration of less than $6*10^{19}$ cm$^{-3}$. The dopant concentration in the second barrier layer is preferably less than $3*10^{19}$ cm$^{-3}$, in particular less than $1*10^{19}$ cm$^{-3}$. In this case, the second barrier layer is preferably likewise n-type, with the dopant being silicon, for example. More preferably, however, the second barrier layer is undoped.

According to another embodiment, the second barrier layer comprises a plurality of sublayers, which have different bandgaps and/or different levels of dopant concentration. In this case, it is advantageous if at a distance of at least 10 nm from the quantum well layer, none of the sublayers have a bandgap larger than a sublayer arranged closer to the quantum well layer. In other words, in this embodiment, the bandgap on the p-side of the quantum well layer does not increase until at a distance of at least 10 nm from the quantum well layer.

According to an advantageous embodiment, the quantum well layer comprises $In_xGa_{1-x}N$, where the indium content is preferably between x=0.1 and x=0.45. In this case, the laser diode chip may be in particular a laser diode chip emitting in the blue or green spectral band. As the indium content increases, the bandgap of the quantum well layer decreases, thereby shifting the emission wavelength towards a longer wavelength. Thus the emission wavelength can be adjusted systematically in particular by the indium content in the quantum well layer.

The thickness of the quantum well layer advantageously equals between 0.5 nm and 15 nm, preferably between 1 nm and 7 nm and more preferably between 2 nm and 5 nm. It is possible that the quantum well layer is doped, for example, is n-type. Preferably, however, the quantum well layer is undoped.

BRIEF DESCRIPTION OF THE DRAWINGS

The invention is described below in greater detail with reference to exemplified embodiments in association with FIGS. 1 to 10, in which.

The same reference signs are used to represent identical or equivalent elements in the figures. The elements shown and the relative sizes thereof shall not be considered to be to scale.

DETAILED DESCRIPTION OF ILLUSTRATIVE EMBODIMENTS

Figure 1:
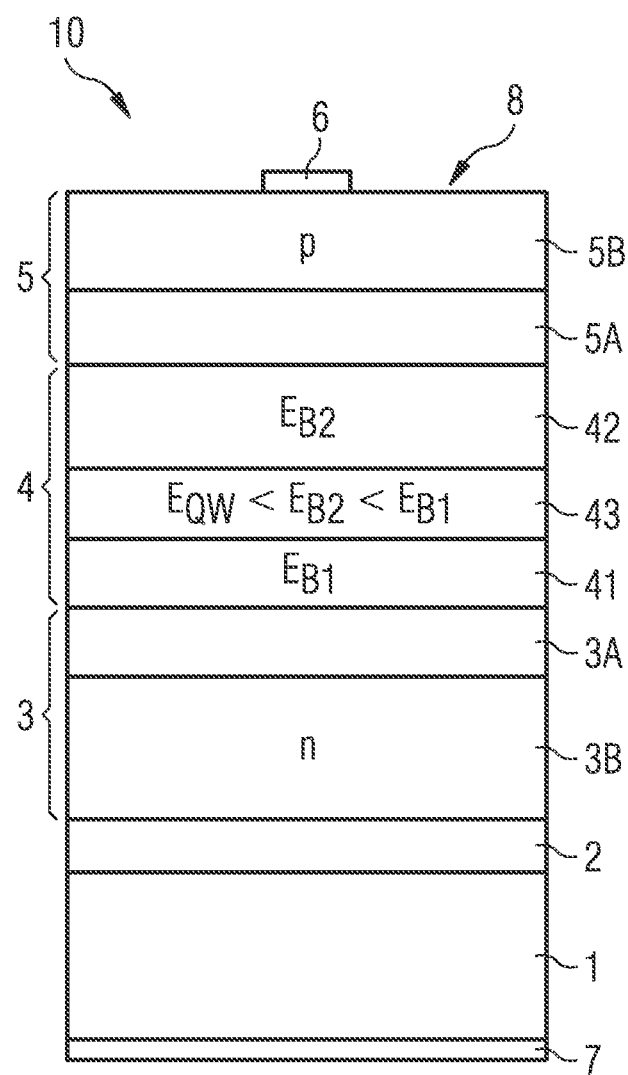
FIG. 1 is a schematic diagram of a cross-section through a laser diode chip according to a first exemplified embodiment.

The laser diode chip 10 shown in FIG. 1 comprises according to one exemplified embodiment a semiconductor layer sequence 3, 4, 5, which comprises an n-type semiconductor region 3, a p-type semiconductor region 5 and an active layer 4, which is arranged between the n-type semiconductor region 3 and the p-type semiconductor region 5 and is suitable for emitting radiation. The semiconductor layer sequence 3, 4, 5 is applied on a substrate 1, for example, wherein at least one buffer layer 2 can be arranged between the growth substrate 1 and the semiconductor layer sequence 3, 4, 5.

For the purpose of making electrical contact with the laser diode chip 10, it is possible to provide, for example, a first contact layer 7 on the rear face of the substrate 1, and a second contact layer 6 on a partial region of the top face 8 of the laser diode chip.

The n-type semiconductor region 3 and the p-type semiconductor region 5 can each be composed of a plurality of sublayers 3A, 3B, 5A, 5B and need not necessarily consist solely of n-type layers or p-type layers, but can also comprise one or more undoped layers, for instance.

The laser diode chip 10 can comprise embodiments of a laser diode chip such as reflective layers on the side faces, waveguide layers and cladding layers and/or patterning as strip lasers, which embodiments are known per se to a person skilled in the art. Such details known per se are not shown here for the sake of simplicity. Instead, only the design of the active layer 4 that is relevant to the principle proposed here is described in detail.

As an alternative to the exemplified embodiment shown, the laser diode chip 10 could also have an opposite polarity, i.e., the p-type semiconductor region 5 could face the substrate 1, and the n-type semiconductor region 3 could face a top face 8 of the laser diode chip (not shown).

The active layer 4 of the laser diode chip 10, which layer is intended for emission of laser radiation, is embodied as a single quantum well structure 41, 42, 43. The single quantum well structure 41, 42, 43 comprises a single optically active quantum well layer 43, which is arranged between a first barrier layer 41 and a second barrier layer 42. The single quantum well structure can consist in particular solely of the first barrier layer 41, the optically active quantum well layer 43 and the second barrier layer 42, i.e., the single quantum well structure preferably comprises no additional layers apart from the stated three layers. An optically active quantum well layer 43 is understood to mean here a quantum well layer 43 that contributes to the radiation emission. In the single quantum well structure, the first barrier layer 41 faces the n-type semiconductor region 3, and the second barrier layer 42 faces the p-type semiconductor region 5. The active layer 4 can be arranged in particular between waveguide layers 3A, 5A.

The quantum well layer 43 has a bandgap $E_{QW}$ that is smaller than the bandgap $E_{B1}$ of the first barrier layer 41 and the bandgap $E_{B2}$ of the second barrier layer 42. In this case, the bandgap $E_{B1}$ of the first barrier layer, which faces the n-type semiconductor region 3, is larger than the bandgap $E_{B2}$ of the second barrier layer 42. Thus for the bandgaps $E_{QW}$, $E_{B1}$ and $E_{B2}$ it holds that $E_{QW} < E_{B2} < E_{B1}$.

In particular, it has been found that an improved temperature stability of the laser threshold and of the operating current can be achieved by a larger bandgap in the n-side barrier layer 41 of the single quantum well structure.

Advantageously, the bandgap of first barrier layer 41 is larger than the bandgap of the second barrier layer 42 by at least 0.04 eV, preferably by at least 0.1 eV and more preferably by at least 0.2 eV.

The bandgap of the semiconductor materials of the quantum well layer 43 and of the barrier layers 41, 42 can be adjusted in particular by adjusting the aluminum content and/or the indium content in the semiconductor material concerned. For example, the quantum well layer 43 and the barrier layers 41, 42 comprise semiconductor materials of composition $In_xAl_yGa_{1-x-y}N$, where $0 \leq x \leq 1$, $0 \leq y \leq 1$ and x+y≤1. For these types of semiconductors, the bandgap increases with increasing aluminum content y and decreases with increasing indium content x.

Figure 2:
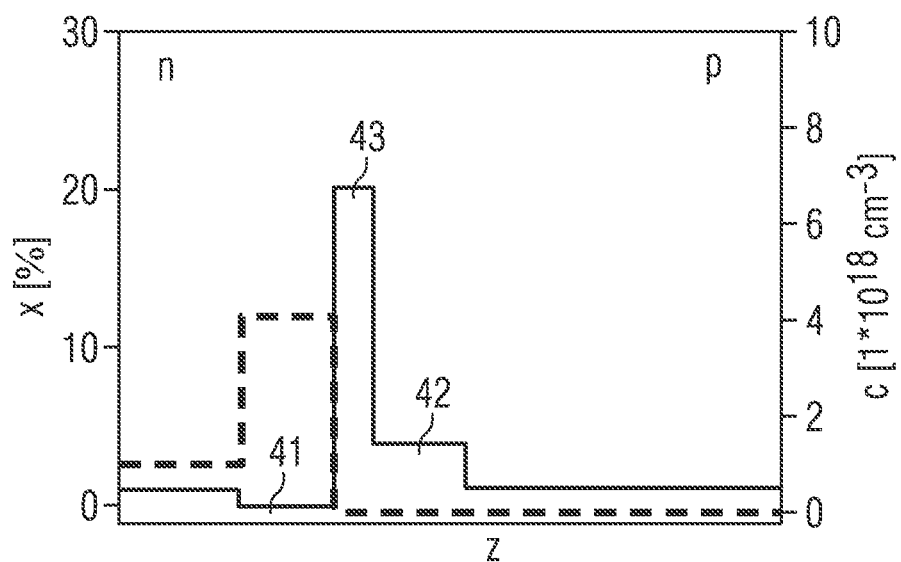
FIGS. 2 to 10 each show for further exemplified embodiments a graph of the indium content x and/or of the aluminum content y and of the dopant concentration c as a function of a spatial coordinate z running in a vertical direction.

FIG. 2 shows for an exemplified embodiment of the laser diode chip the indium content x in the region of the active layer 4 as a function of the spatial coordinate z, which points from the n-type semiconductor region to the p-type semiconductor region. The figure also shows the dopant concentration c. In this figure and the subsequent figures, the continuous line shows the indium content and the dashed line shows the dopant concentration.

In the exemplified embodiment of FIG. 2, the barrier layers 41, 42 and the quantum well layer 43 each comprise $In_xGa_{1-x}N$. As can be seen in FIG. 2, the first barrier layer 41 has an indium content x=0, i.e., it comprises GaN. The quantum well layer 43 and the second barrier layer 42 are each $In_xGa_{1-x}N$ layers, with the indium content of the quantum well layer 43 being higher than the indium content of the second barrier layer 42. Thus the electronic bandgap of the first barrier layer 41 is larger than the electronic bandgap of the quantum well layer 43 and of the second barrier layer 42. In the exemplified embodiment of FIG. 2, the first barrier layer 41 is n-type, where the dopant is silicon and the dopant concentration $c=4*10^{18}$ cm$^{-3}$. The quantum well layer 43 and the second barrier layer 42 are advantageously undoped.

Figure 3:
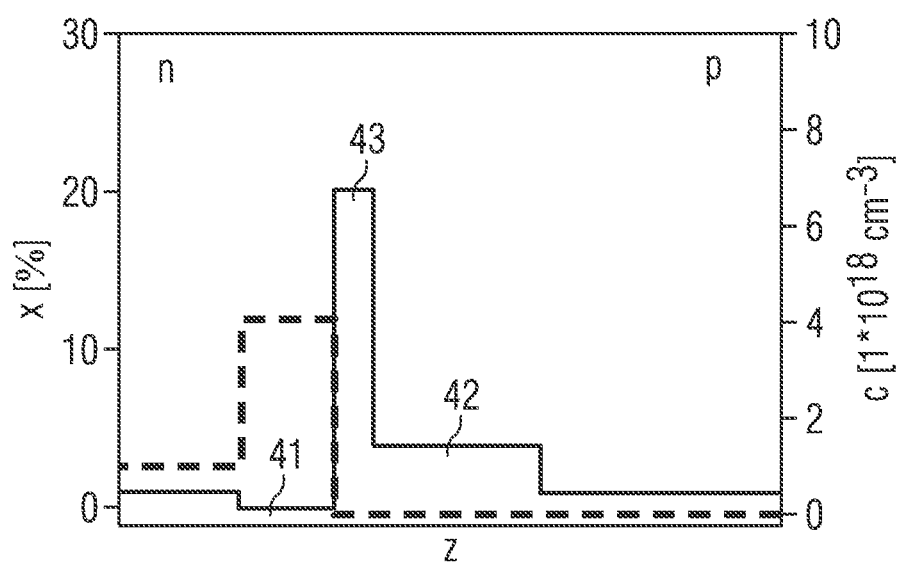

FIG. 3 shows the variation in the indium content x and the dopant concentration c for another exemplified embodiment. The exemplified embodiment of FIG. 3 differs from the previous exemplified embodiment in that the second barrier layer 42 has a larger layer thickness. The second barrier layer 42 is preferably at least 10 nm thick. The exemplified embodiment of FIG. 3 corresponds to the previous exemplified embodiment in other regards.

Figure 4:
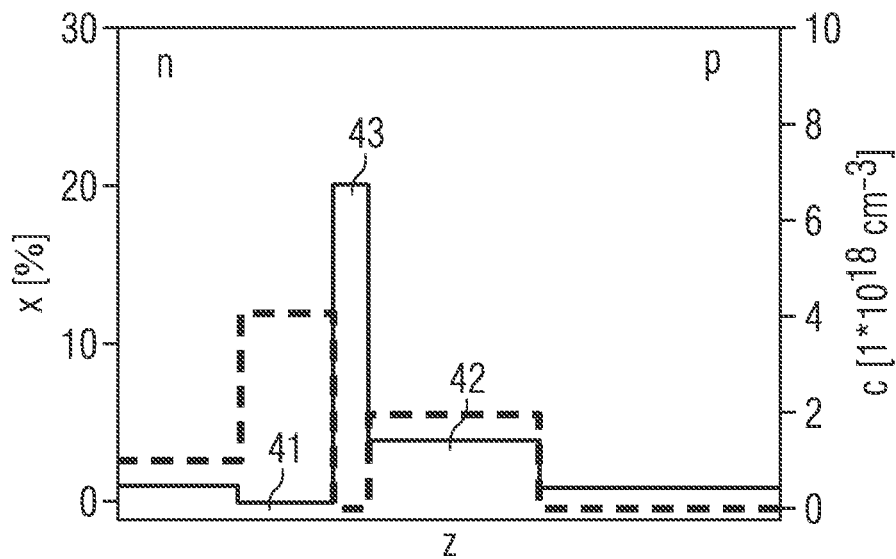

The quantum well layer 43 and/or the second barrier layer 42 need not necessarily be undoped. For instance FIG. 4 shows an exemplified embodiment that differs from the previous exemplified embodiment in that the second barrier layer 42 is also doped. In this exemplified embodiment, only the quantum well layer 43 is undoped.

Figure 5:
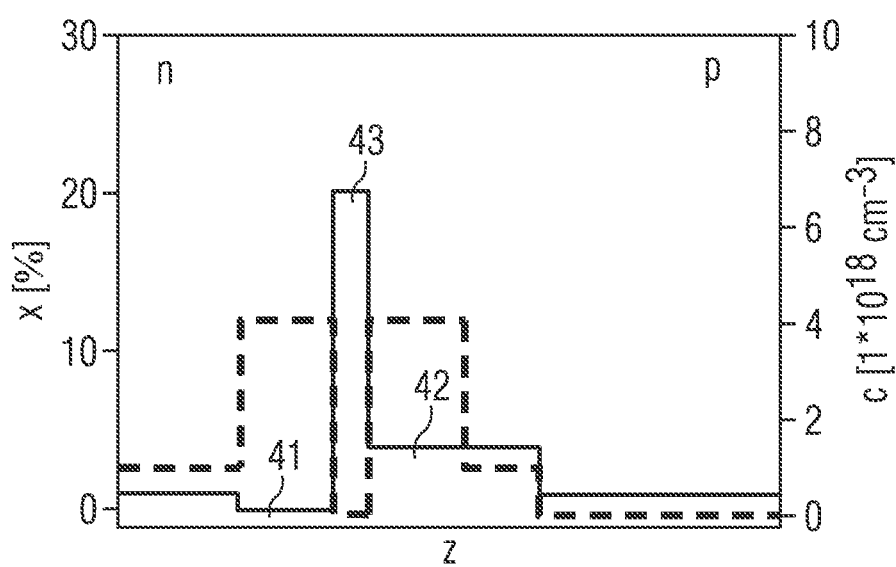

It is also possible that at least one of the barrier layers 41, 42 and/or the quantum well layer 43 are only doped in part, or have a dopant concentration that exhibits a stepped variation or a gradient. For instance in the exemplified embodiment of FIG. 5, a region of the second barrier layer 42, which region adjoins the quantum well layer 43, is more heavily doped than a subsequent region of the second barrier layer 42.

Figure 6:
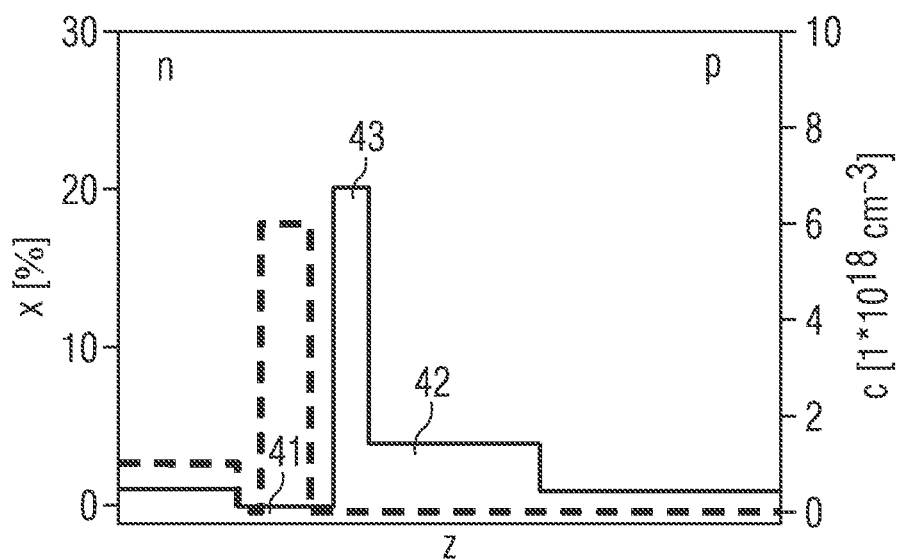

FIG. 6 shows a further exemplified embodiment, in which the first barrier layer 41 has a stepped dopant concentration. A central region of the first barrier layer 41 is doped whereas the edge regions adjoining the n-type semiconductor region and adjoining the quantum well layer 43 are undoped. In this exemplified embodiment, the quantum well layer 43 and the second barrier layer 42 are also both undoped.

Figure 7:
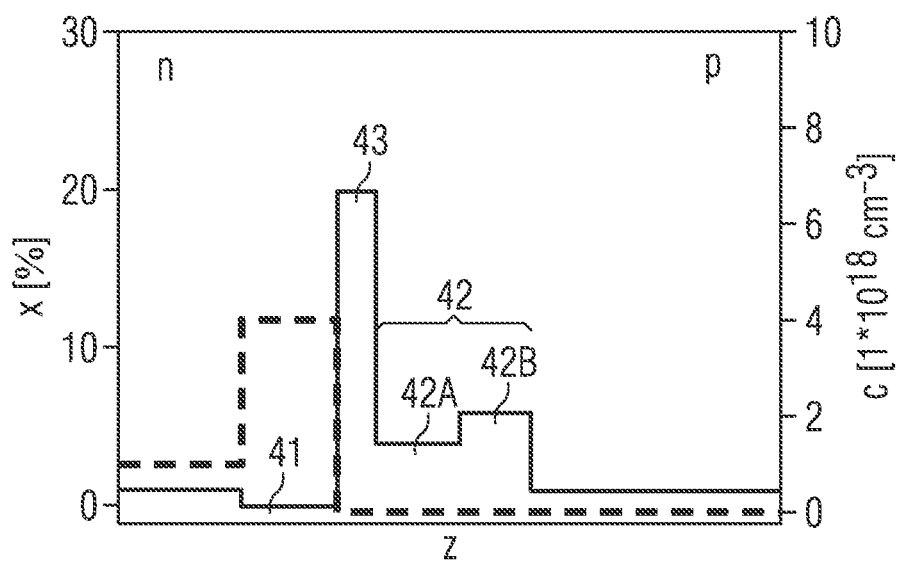

In a further embodiment of the laser diode chip, the second barrier layer 42 can comprise a plurality of sublayers. FIG. 7 shows such an exemplified embodiment. In this case, the second barrier layer 42 comprises a first sublayer 42A and a second sublayer 42B, the first sublayer 42A having a lower indium content x than the second sublayer 42B. Both sublayers 42A, 42B have a higher indium content x and thus a smaller bandgap than the first barrier layer 41.

Figure 8:
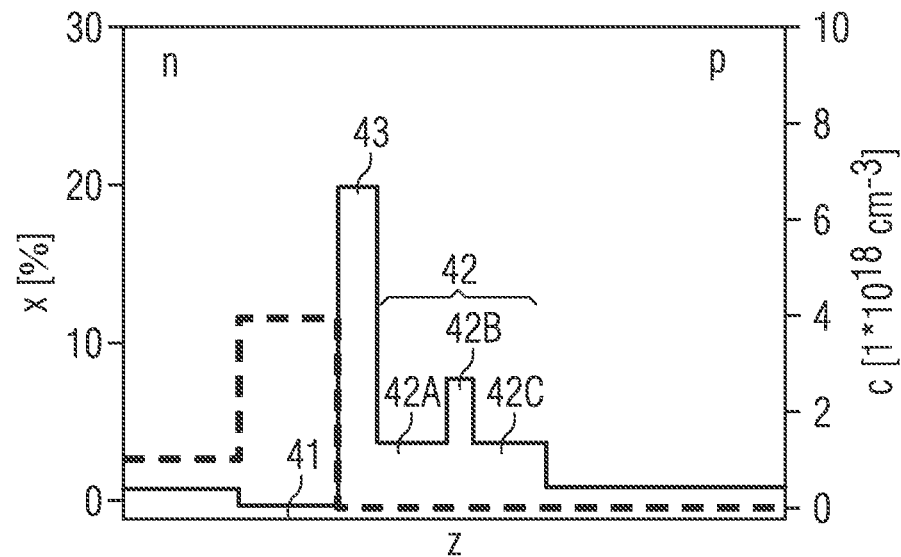

FIG. 8 shows a further exemplified embodiment, in which the second barrier layer 42 is composed of a plurality of sublayer 42A, 42B and 42C. In this exemplified embodiment, the indium content x in the second sublayer 42B is higher than in the first sublayer 42A and in the third sublayer 42C. All the sublayers 42A, 42B, 42C of the second barrier layer have a higher indium content x than the first barrier layer 41. Thus in the embodiment having a plurality of sublayers, the electronic bandgap in the entire second barrier layer 42 is smaller than the bandgap of the first barrier layer 41.

Figure 9:
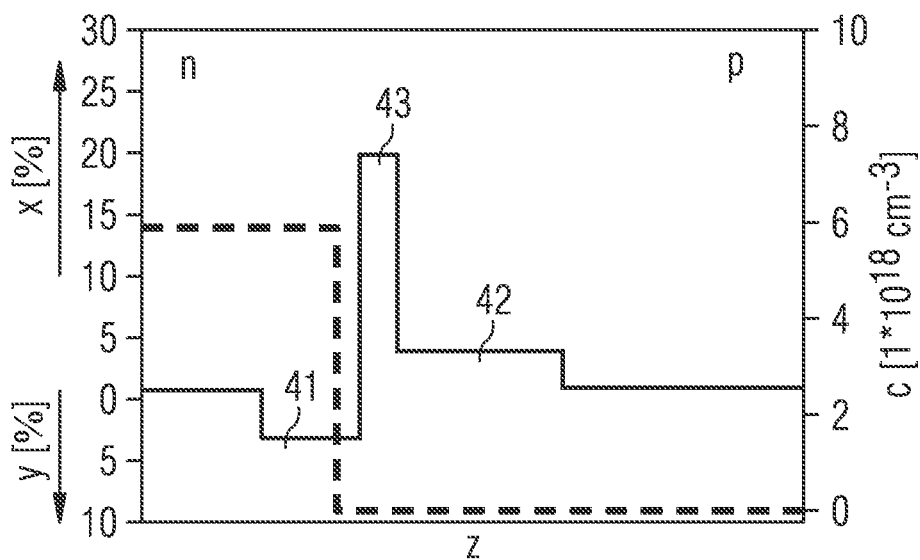
Figure 10:
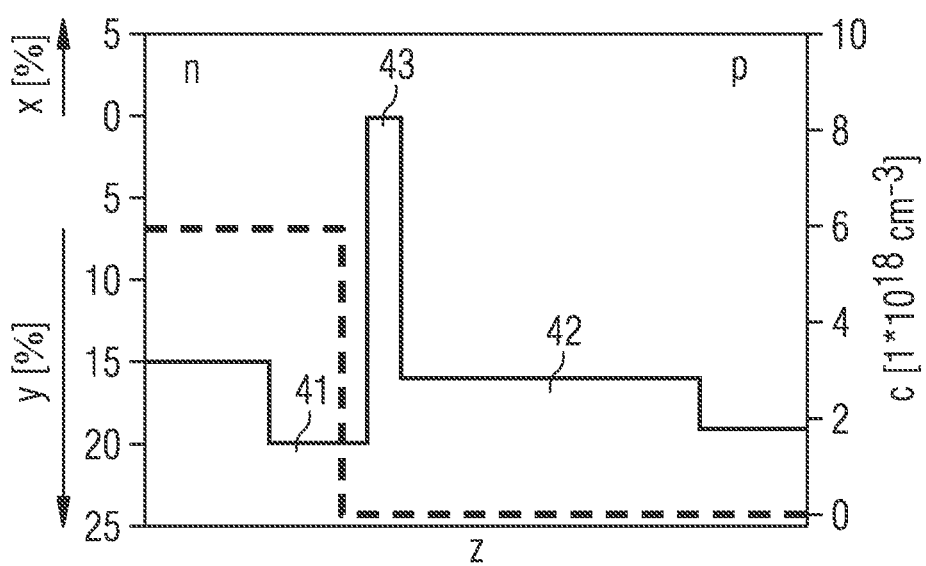

In the exemplified embodiments shown so far, the barrier layers 41, 42 and the quantum well layer 43 each have a composition $In_xGa_{1-x}N$. In general, however, the barrier layers 41, 42 and/or the quantum well layer 43 can also comprise a nitride compound semiconductor material having an aluminum content, in particular the composition $In_xAl_yGa_{1-x-y}N$, where 0≤x≤1, 0≤y≤1 and x+y≤1. FIGS. 9 and 10 show such exemplified embodiments.

In the exemplified embodiment shown in FIG. 9, the first barrier layer 41 comprises $Al_yGa_{1-y}N$ whereas the quantum well layer 43 and the second barrier layer 42 each comprise $In_xGa_{1-x}N$. In FIG. 9, the continuous line indicates for the first barrier layer 41 the aluminum content y, which is plotted downwards on the ordinate, and for the other layers indicates the indium content x, which is plotted upwards on the ordinate. By virtue of its aluminum content, the first barrier layer 41 has a larger electronic bandgap than the quantum well layer 43 and the second barrier layer 42.

FIG. 10 also shows a further exemplified embodiment, in which the first barrier layer 41 and the second barrier layer each comprise $Al_yGa_{1-y}N$, and wherein the quantum well layer 43 comprises GaN (indium content x=0, aluminum content y=0). The aluminum content y and the indium content x are represented on the ordinate in the same manner as for the exemplified embodiment shown in FIG. 9. In this exemplified embodiment, the laser diode is intended for emission in the UV band. For this purpose, the quantum well layer 43 and the barrier layers 41, 42 each have a larger bandgap than in the previous exemplified embodiments. The larger bandgap is obtained by the increased aluminum content y in the barrier layers 41, 42 and by the indium content x=0 in the quantum well layer 43.

The description referring to the exemplified embodiments does not limit the invention. Instead, the invention includes every novel feature and every combination of features, which in particular includes every combination of features in the claims, even if this feature or combination is not itself explicitly mentioned in the claims or exemplified embodiments.

What is claimed is:

1. A laser diode chip comprising:
    an n-type semiconductor region;
    a p-type semiconductor region; and
    an active layer arranged between the n-type semiconductor region and the p-type semiconductor region, wherein the active layer is in the form of a single quantum well structure,
    wherein the single quantum well structure comprises a quantum well layer arranged between a first barrier layer and a second barrier layer, wherein the first barrier layer faces the n-type semiconductor region, and the second barrier layer faces the p-type semiconductor region,
    wherein an electronic bandgap EQW of the quantum well layer is smaller than an electronic bandgap EB1 of the first barrier layer and smaller than an electronic bandgap EB2 of the second barrier layer,
    wherein the electronic bandgap EB1 of the first barrier layer is larger than the electronic bandgap EB2 of the second barrier layer, wherein the second barrier layer comprises a plurality of sublayers, which have different bandgaps and/or different levels of dopant concentration, and wherein, at a distance of at least 10 nm from the quantum well layer, none of the sublayers have a bandgap larger than a sublayer arranged closer to the quantum well layer.

2. The laser diode chip as claimed in claim 1, wherein a difference between the electronic bandgaps of the first barrier layer and of the second barrier layer is given by $EB1-EB2 \geq 0.04$ eV.

3. The laser diode chip as claimed in claim 2, wherein the difference between the electronic bandgaps of the first barrier layer and of the second barrier layer is given by $EB1-EB2 \geq 0.1$ eV.

4. The laser diode chip as claimed in claim 1, wherein the first barrier layer and the second barrier layer each comprises $In_xAl_yGa1-x-yN$, where $0 \leq x \leq 1$, $0 \leq y \leq 1$ and $x+y \leq 1$.

5. The laser diode chip as claimed in claim 4, wherein an aluminum content y of the first barrier layer is higher than an aluminum content y of the second barrier layer.

6. The laser diode chip as claimed in claim 4, wherein an indium content x of the first barrier layer is lower than an indium content x of the second barrier layer.

7. The laser diode chip as claimed in claim 4, wherein the first barrier layer comprises $In_xAl_yGa1-x-yN$, where $0 \leq x \leq 0.07$, $0 \leq y \leq 0.1$ and $x+y \leq 1$.

8. The laser diode chip as claimed in claim 4, wherein the second barrier layer comprises $In_xAl_yGa1-x-yN$, where $0 \leq x \leq 0.1$, $0 \leq y \leq 0.07$ and $x+y \leq 1$.

9. The laser diode chip as claimed in claim 1, wherein the first barrier layer has a thickness between 0.25 nm and 30 nm.

10. The laser diode chip as claimed in claim 1, wherein the second barrier layer has a thickness of at least 10 nm.

11. The laser diode chip as claimed in claim 1, wherein the first barrier layer is doped and the second barrier layer is undoped.

12. The laser diode chip as claimed in claim 1, wherein a dopant concentration in the first barrier layer equals between $1*10^{17}$ cm$^{-3}$ and $3*10^{19}$ cm$^{-3}$.

13. The laser diode chip as claimed in claim 1, wherein the first barrier layer is an n-type layer.

14. The laser diode chip as claimed in claim 1, wherein the single quantum well structure consist of the first barrier layer, the quantum well layer and the second barrier layer.

* * * * *